United States Patent [19]

Coleman et al.

[11] Patent Number: 4,823,090

[45] Date of Patent: Apr. 18, 1989

[54] DIGITAL SIGNAL SYNTHESIS USING LOW FREQUENCY SAMPLING CLOCK

[75] Inventors: Mike R. Coleman; John J. Ciardi, both of Beaverton, Oreg.

[73] Assignee: Tektronix, Inc., Beaverton, Oreg.

[21] Appl. No.: 103,997

[22] Filed: Oct. 2, 1987

[51] Int. Cl.⁴ .................... H03B 19/00; H03K 19/00
[52] U.S. Cl. .................................. 328/114; 307/479; 331/18; 328/138
[58] Field of Search ............... 328/14, 109, 140, 138; 331/18, 32; 307/479

[56] References Cited

U.S. PATENT DOCUMENTS

| 3,772,681 | 11/1973 | Skingle | 328/14 |
| 3,952,189 | 4/1976 | Fabricius | 328/14 |
| 4,556,869 | 12/1985 | Thomson | 328/14 |
| 4,740,995 | 4/1988 | Schevin et al. | 328/14 |

Primary Examiner—Stanley D. Miller
Assistant Examiner—Richard Roseen
Attorney, Agent, or Firm—Francis I. Gray

[57] ABSTRACT

A digital signal synthesizer stores a representation of a desired analog signal in the form of digital samples. The digital samples are converted to an analog signal by a sample clock having a frequency greater than or equal to twice the bandwidth of the desired analog signal. The analog signal is band pass filtered to recover the desired analog signal.

2 Claims, 4 Drawing Sheets

DIGITAL SIGNAL SYNTHESIS USING LOW FREQUENCY SAMPLING CLOCK

BACKGROUND OF THE INVENTION

The present invention relates to digital signal synthesis, and more particularly to a digital signal synthesis technique using a sample clock as low as twice the bandwidth of the signal being synthesized.

A digital signal synthesizer produces a signal by applying a sampled digital representation of the signal to a digital-to-analog converter under control of a sample clock. A high frequency signal F(w) to be synthesized is shown in FIG. 1 in the frequency domain. A sampled representation of the signal F(w) is stored in a data storage device as shown in FIG. 2. The samples from the data storage device are applied to a digital-to-analog converter at a regular rate indicated by the pulse period T which, to avoid aliasing distortion, has a lower limit $$w_o = 2*pi/T \geq 2(w_c + W) \qquad (1)$$

where W is the bandwidth and $w_c$ is the frequency of the signal F(w). FIG. 3 illustrates the frequency domain representation of the signal at the output of the digital-to-analog converter. The desired signal F(w) is surrounded by spectral replicas that repeat in the frequency domain every $w_o$ radians. A low pass filter is used to remove the unwanted spectral replicas, producing the desired signal at the output whose frequency domain representation is equivalent to the signal in FIG. 1. As illustrated such conventional digital signal synthesis requires that the sample clock frequency be greater than twice the highest frequency of the signal in order to assure accurate reconstruction of the signal following digital-to-analog conversion. Synthesis of very high frequencies using such a traditional method uses complex digital hardware and large sample memories because of the very high sample clock rate requirement.

Therefore what is desired is a means for digitally synthesizing high frequency signals without a high sample rate clock and related complex digital hardware.

SUMMARY OF THE INVENTION

Accordingly the present invention provides a digital signal synthesizer using a low sample clock rate. A digital representation of the signal to be synthesized is stored in a data storage device. The digital samples from the data storage device are applied to a digital-to-analog converter at a sample rate whose minimum frequency is greater than or equal to twice the signal bandwidth. A band pass filter is centered around the frequency of the signal to obtain the desired output signal.

The objects, advantages and other novel features of the present invention will be apparent from the following detailed description when read in conjunction with the appended claims and attached drawing.

DESCRIPTION OF THE PREFERRED EMBODIMENT

Figure 4:
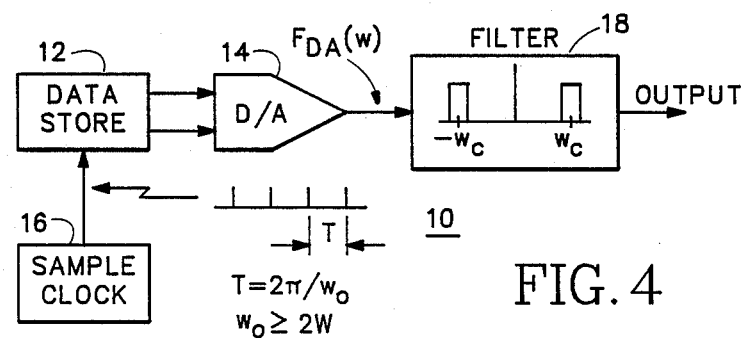
FIG. 4 is a block diagram of a digital signal synthesizer according to the present invention.

Referring now to FIG. 4 a digital signal synthesizer 10 is shown. A data storage device 12 contains a representation of a desired signal F(w) in the form of digital samples. These digital samples are clocked from the data storage device 12 into a digital-to-analog converter (DAC) 14 by a clock signal $w_o$ from a sample clock 16, the clock signal having a period T. The rate of the clock signal is greater than or equal to twice the bandwidth W of the desired signal, i.e., $$w_o = 2*pi/T \geq 2W. \qquad (2)$$

Figure 1:
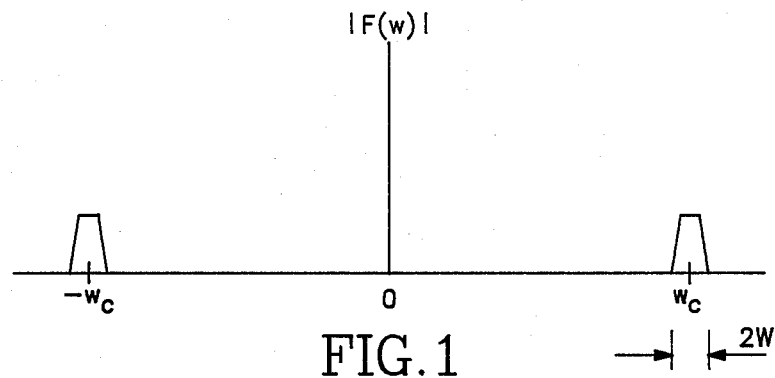
FIG. 1 is a representation in the frequency domain of a signal to be synthesized.
Figure 5:
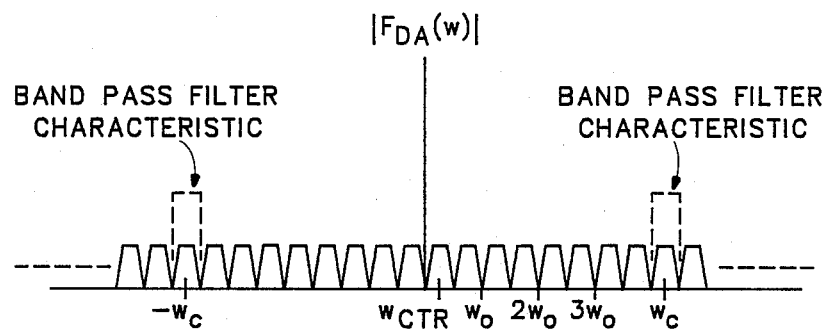
FIG. 5 is a representation in the frequency domain of the signal at the output of the digital-to-analog converter of the digital signal synthesizer of FIG. 4.

The output from the DAC 14 as shown in FIG. 5 is input to a band pass filter 18 to recover the desired signal as shown in FIG. 1. The band pass filter 18 is centered around $w_c$, the desired frequency of the signal. The sample period T is selected so that the spectral replicas do not overlap and cause aliasing distortion, which is assured by selecting T to satisfy equation (2). One of the spectral replicas should center itself at the desired frequency $w_c$ of the signal. This is done by choosing a center frequency $w_{ctr}$ in the representation of the signal in the data storage device 12 such that $w_{ctr}$ added to a multiple of $w_o$ produces $w_c$.

Figure 2:
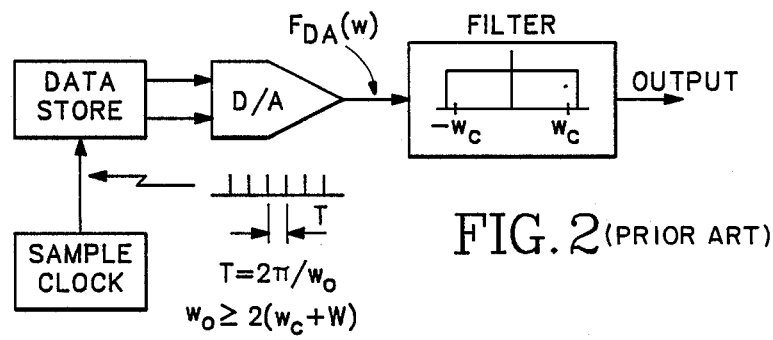
FIG. 2 is a block diagram of a conventional digital signal synthesizer.
Figure 3:
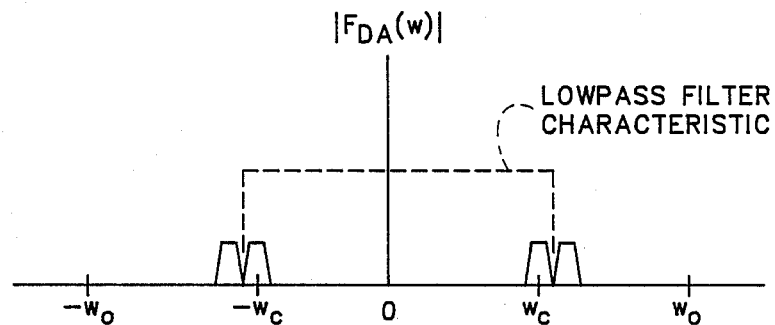
FIG. 3 is a representation in the frequency domain of the signal at the output of the digital-to-analog converter of the conventional digital signal synthesizer of FIG. 2.
Figure 7:
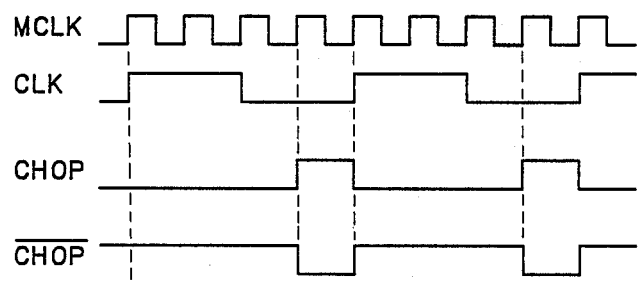
FIG. 7 is a waveform diagram for the digital signal synthesizer of FIG. 6.
Figure 6:
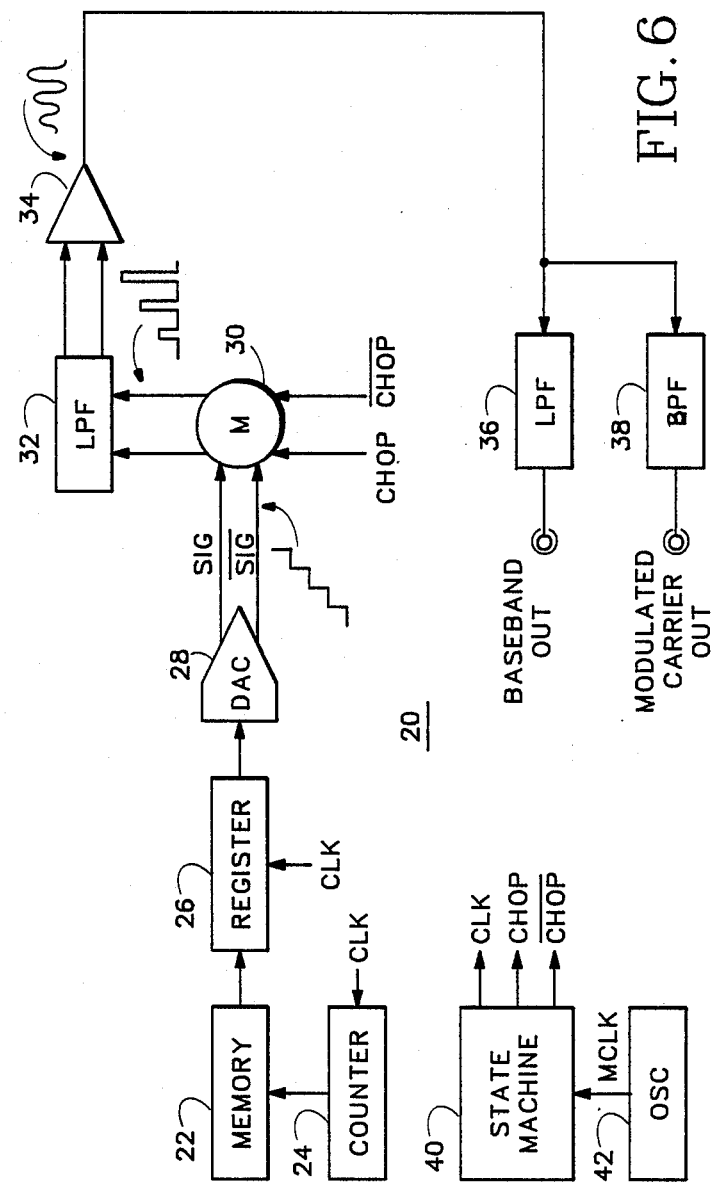
FIG. 6 is a block diagram of a specific embodiment of a digital signal synthesizer according to the present invention.

One specific application for the digital signal synthesizer as described above is in the digital synthesis of a 4.5 MHz calibration signal used to test television audio circuits. FIG. 6 shows a calibration circuit 20 that uses digital synthesis of the 4.5 MHz signal as well as low frequency audio signals. A waveform memory 22 contains a sampled and quantized digital representation of a usable MTS signal in a pattern that can be generated continuously by cycling repeatedly through the memory. If the length of the waveform data in the memory 22 is 13,728 samples, the use of a 4 MHz clock allows all the MTS subcarrier frequencies to be generated precisely and to be modulated in the specified fashion by a sinusoid having a frequency of 4 MHz/13,728 = 291.375 Hz or multiples thereof. A binary address counter 24 is programmable to a required length count equivalent to the length of the waveform data, i.e., 13,728, and is used to cycle through the memory 22 at the sample clock rate, i.e., 4 MHz. The output of the memory 22 is input via an output register 26 to a DAC 28, the output register being clocked by the sample clock CLK. A differential output SIG, /SIG from the DAC 28 is resampled by a differential signal CHOP, /CHOP in a mixer 30 to produce an impulsive differential signal. The impulsive differential signal is then processed by a low pass filter 32 and converted to a single-ended output by a differential amplifier 34 as a sinusoid signal. The output from the differential amplifier 34 is input to another low pass filter 36 to obtain baseband signals and to a band pass filter 38 to obtain the modulated carrier signal. A state machine 40 generates the necessary timing signals CLK, CHOP, CHOP for the calibration circuit 20 from an oscillator 42 that generates a high frequency clock signal MCLK which is a multiple of the sample clock CLK, such as 16 MHz for a 4 MHz sample clock. The relationship of the timing signals for the state machine 40 are shown in FIG. 7. As can be seen the CHOP, /CHOP signals cause the differential output SIG, /SIG to be resampled in the last quarter of the hold period of the DAC 28. The "chopping" of the DAC output increases the spectral energy of the high frequency (4.5 MHz) aliased image and diminishes spectral high frequency roll-off in baseband signals by decreasing the effective data "hold" time by one-quarter. By using the described synthesizer the same calibration circuit produces the 4.5 MHz signal as well as low audio frequency (0–200 KHz) signals necessary for testing television audio circuits. The highest sample clock frequency is 4 MHz for this specific application, which is well below the sample frequency of 9 MHz or greater that is required by the conventional digital signal synthesizer of FIG. 2.

Thus the present invention provides a digital signal synthesizer which uses a lower sampling frequency than conventional techniques together with a band pass filter to obtain the desired synthesized signal.

What is claimed is:

1. A digital signal synthesizer for generating a desired analog signal having a predetermined frequency and bandwidth from digital samples representing the desired analog signal comprising:
   means for storing the digital samples;
   means for converting the digital samples from the storing means to an analog signal at a rate which is greater than or equal to twice the bandwidth of the desired analog signal; and
   means for band pass filtering the analog signal from the converting means around the predetermined frequency to produce the desired analog signal.

2. A calibration circuit for generating a modulated high frequency subcarrier and baseband signals comprising:
   means for storing a representation of the modulated high frequency subcarrier and baseband signals in the form of digital samples;
   means for converting the digital samples from the storing means to an analog signal at a rate which is greater than or equal to twice the bandwidth of the modulated high frequency subcarrier and baseband signals;
   means for resampling the analog signal from the converting means to produce an impulsive analog signal;
   means for filtering the impulsive analog signal from the resampling means to produce a sinusoid analog signal; and
   means for separating the sinusoid analog signal into the modulated high frequency subcarrier and the baseband signals.

* * * * *